(12) United States Patent
Lee et al.

(10) Patent No.: US 7,989,904 B2
(45) Date of Patent: Aug. 2, 2011

(54) MICRO-ELECTROMECHANICAL DEVICE AND MANUFACTURING METHOD THEREOF

(75) Inventors: Cheng-Chang Lee, Taoyuan Hsien (TW); Horng-Jou Wang, Taoyuan Hsien (TW); Zong-Ting Yuan, Taoyuan Hsien (TW); Chao-Jui Liang, Taoyuan Hsien (TW); Hsieh-Shen Hsieh, Taoyuan Hsien (TW); Huang-Kun Chen, Taoyuan Hsien (TW); Tai-Kang Shing, Taoyuan Hsien (TW)

(73) Assignee: Delta Electronics Inc., Kuel San, Taoyuan Hsien (TW)

( * ) Notice: Subject to any disclaimer, the term of this patent is extended or adjusted under 35 U.S.C. 154(b) by 441 days.

(21) Appl. No.: 12/016,889

(22) Filed: Jan. 18, 2008

(65) Prior Publication Data
US 2008/0217787 A1    Sep. 11, 2008

(30) Foreign Application Priority Data

Mar. 9, 2007  (TW) ............................... 96108095 A (51) Int. Cl.
*H01L 27/14*      (2006.01)
(52) U.S. Cl. .......................................... 257/414; 438/50
(58) Field of Classification Search .................. 257/414; 438/50
See application file for complete search history.

(56) References Cited

U.S. PATENT DOCUMENTS
5,880,921 A * 3/1999 Tham et al. .................. 361/233
* cited by examiner

*Primary Examiner* — Jami M Valentine
(74) *Attorney, Agent, or Firm* — Birch, Stewart, Kolasch & Birch, LLP (57) ABSTRACT

A micro-electromechanical device includes a substrate, a first patterned conductive layer, a second patterned conductive layer and a first patterned blocking layer. The first patterned conductive layer is disposed on the substrate. The second patterned conductive layer is disposed on the first patterned conductive layer. The first patterned blocking layer is connected with the first patterned conductive layer and the second patterned conductive layer. In addition, a method of manufacturing the micro-electromechanical device is also disclosed.

12 Claims, 7 Drawing Sheets

MICRO-ELECTROMECHANICAL DEVICE AND MANUFACTURING METHOD THEREOF

CROSS REFERENCE TO RELATED APPLICATIONS

This Non-provisional application claims priority under 35 U.S.C. §119(a) on Patent Application No(s). 096108095 filed in Taiwan, Republic of China on Mar. 9, 2007, the entire contents of which are hereby incorporated by reference.

BACKGROUND OF THE INVENTION

1. Field of Invention

The invention relates to a micro-electromechanical device and in particular, to a micro-electromechanical device having a micro suspended structure. The invention also relates a manufacturing method thereof.

2. Related Art

The current semiconductor manufacturing technology has been well developed. With the enhancement of the technology, the complementary metal-oxide semiconductor (CMOS) manufacturing technology for manufacturing a micro-electromechanical device has become one of the frequently used technologies in the industry.

In the micro-electromechanical device, a suspended metal structure usually serves as a sensing or driving unit, which receives a driving signal (e.g., voltage or current) and then generates a magnetic force to actuate the suspended metal structure to perform the sensing or driving operation.

Figure 1A:
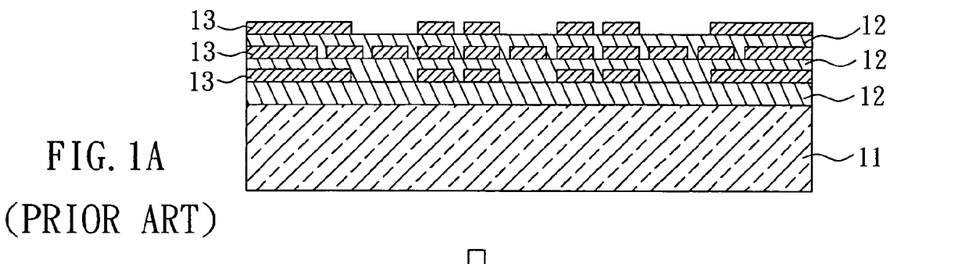
FIGS. 1A to 1C are schematic illustrations showing processes for manufacturing a conventional micro-electromechanical device.
Figure 1B:
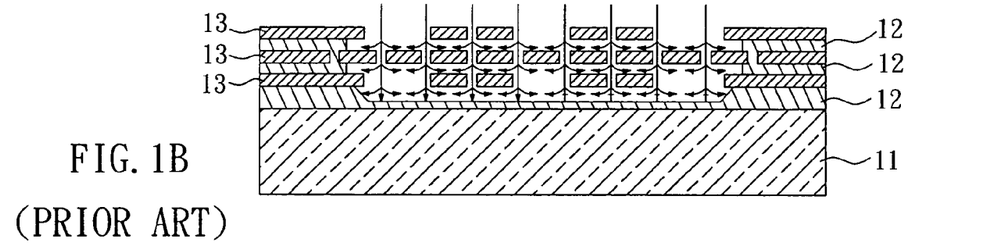
Figure 1C:
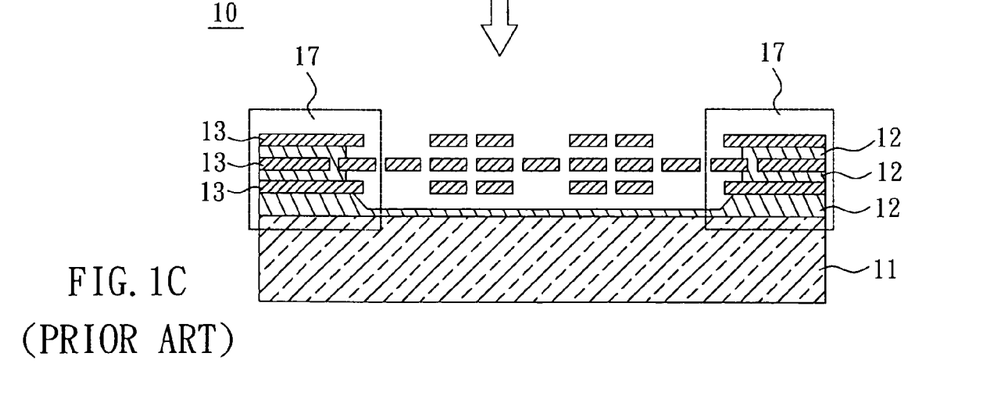

As shown in FIG. 1A, a conventional micro-electromechanical device 10 includes a substrate 11, and a plurality of dielectric layers 12 and a plurality of patterned metal layers 13 alternately stacked on the substrate 11. Then, as shown in FIG. 1B, portions of the dielectric layers 12 are removed by isotropic etching so that the micro-electromechanical device 10 shown in FIG. 1C is formed. However, because the portions of the dielectric layers 12 are removed by the isotropic etching, the etching time has to be precisely controlled to prevent the problem that the patterned metal layers 13 cannot be suspended due to the insufficient etching time, or that too large portions of the dielectric layers 12 are removed to reduce the structure intensity of a fixed end 17 due to the over etching time. In addition, in the CMOS manufacturing process, a thickness of each patterned metal layers is usually only several thousands of angstroms (Å) so that the rigidity of the patterned metal layer is insufficient and the micro-electromechanical device 10 may be deformed.

Figure 2A:
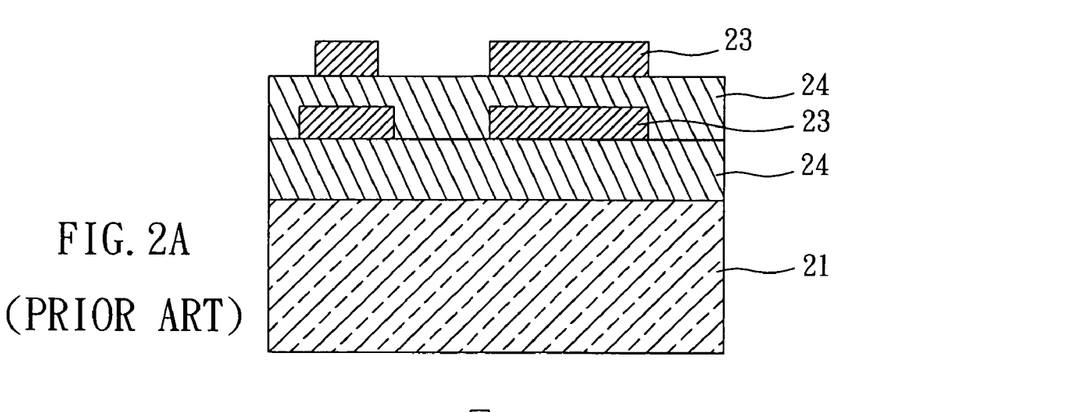
FIGS. 2A to 2C are schematic illustrations showing processes for manufacturing another conventional micro-electromechanical device.
Figure 2B:
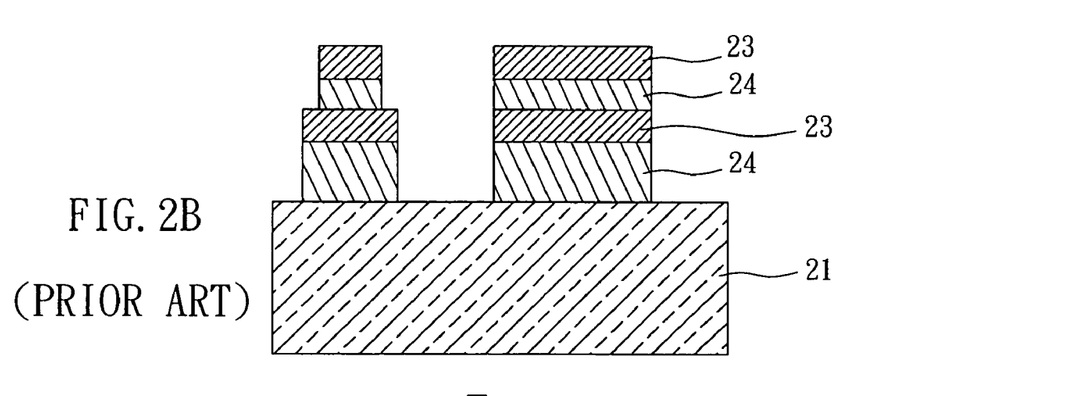
Figure 2C:
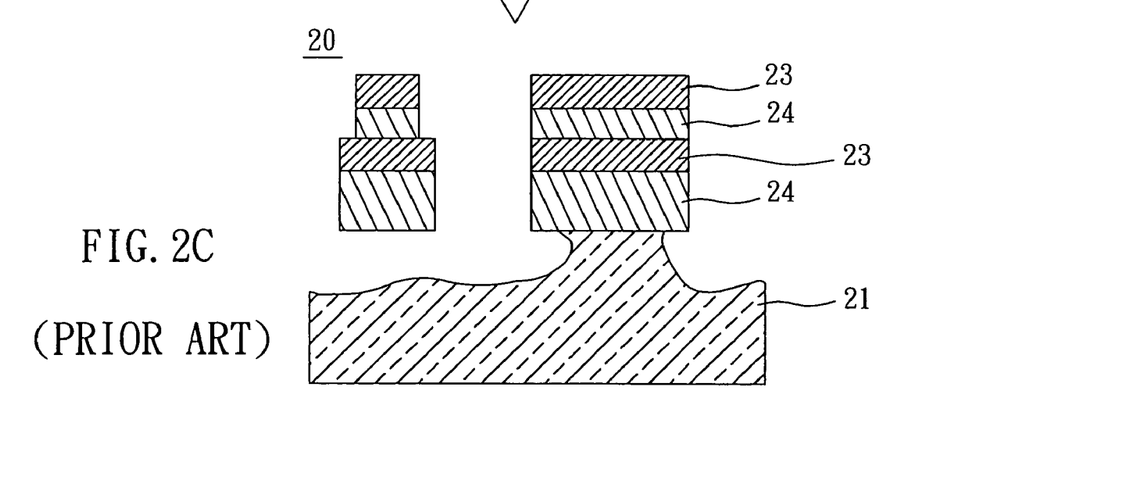

As shown in FIG. 2A, another conventional micro-electromechanical device 20 includes a plurality of insulating layers 24 and a plurality of patterned metal layers 23 alternately stacked on a substrate 21. Next, as shown in FIG. 2B, portions of the insulating layers 24 are removed by anisotropic etching. Then, as shown in FIG. 2C, a portion of the substrate 21 is removed by isotropic etching so that the structure constituted by the patterned metal layers 23 and portions of the insulating layers 24 can be suspended. Although this arrangement can increase the rigidity of the micro-electromechanical device 20, only the single-layer suspended structure can be manufactured. That is, the flexibility in design is insufficient. In addition, the etching time still has to be precisely controlled in order to prevent the over-etching or under-etching phenomenon.

Figure 3A:
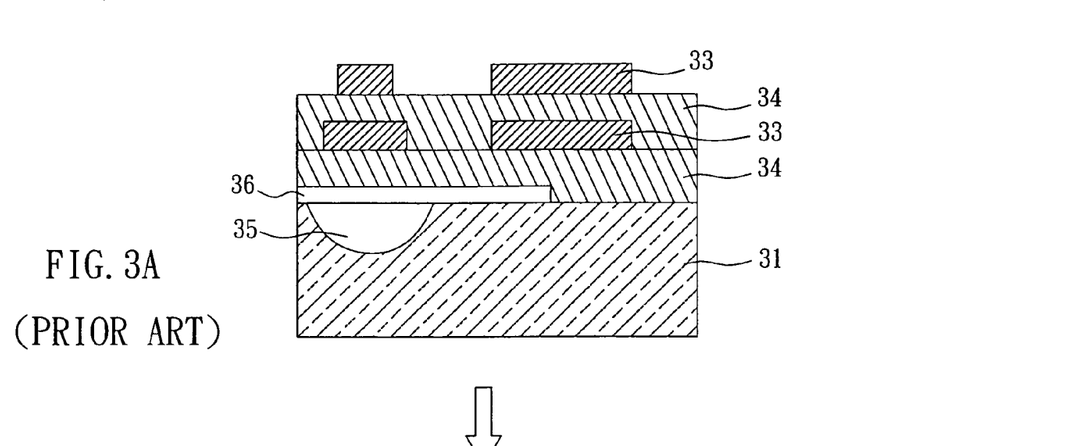
FIGS. 3A to 3C are schematic illustrations showing processes for manufacturing still another conventional micro-electromechanical device.
Figure 3B:
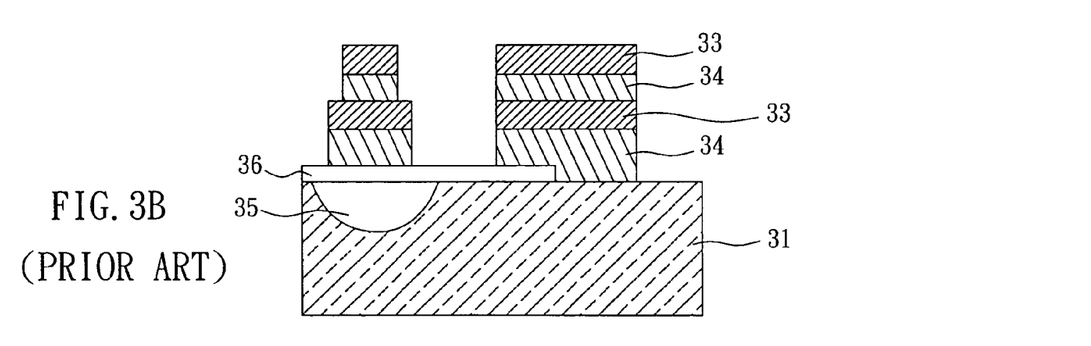
Figure 3C:
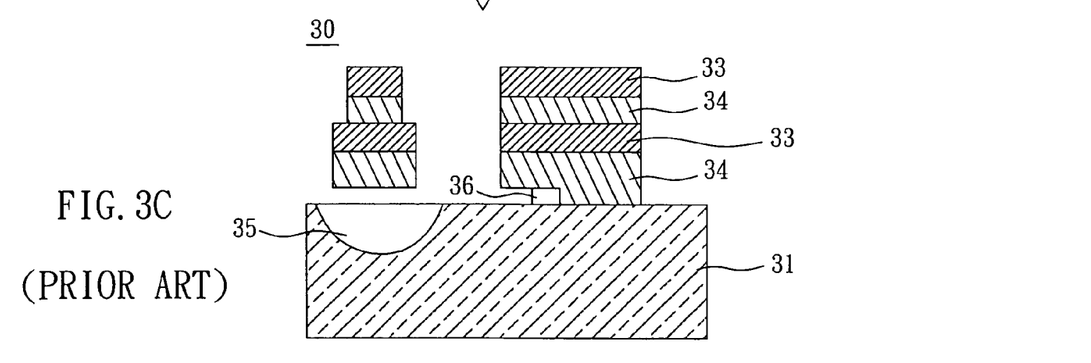

In addition, as shown in FIG. 3A, another micro-electromechanical device 30 includes a substrate 31 having a conductive portion 35 and a sacrificial layer 36. A plurality of insulating layers 34 and patterned metal layers 33 are alternately formed on the substrate 31. As shown in FIG. 3B, portions of the insulating layers 34 are removed by anisotropic etching, and then a portion of the sacrificial layer 36 is removed by isotropic etching. Therefore, as shown in FIG. 3C, the micro-electromechanical device 30 is formed. However, the sacrificial layer 36 has a limited thickness (about several thousands of angstroms), so the micro-electromechanical device 30, which is constituted by the insulating layers 34 and the patterned metal layers 33, may stick on the conductive portion 35 of the substrate 31, thereby causing the malfunction.

Therefore, it is an important subject to provide a micro-electromechanical device and a manufacturing method thereof, in which the structure intensity can be enhanced and the manufacturing processes can be simplified.

SUMMARY OF THE INVENTION

In view of the foregoing, the invention is to provide a micro-electromechanical device and a manufacturing method thereof, in which the structure intensity can be enhanced and the manufacturing processes can be simplified.

To achieve the above, the invention discloses a micro-electromechanical device including a substrate, a first patterned conductive layer, a second patterned conductive layer and a first patterned blocking layer. The first patterned conductive layer is disposed on the substrate. The second patterned conductive layer is disposed on the first patterned conductive layer. The first patterned blocking layer is connected to the first and second patterned conductive layers.

To achieve the above, the invention also discloses a manufacturing method of a micro-electromechanical device. The manufacturing method includes the steps of: forming a first dielectric layer on a substrate, forming a first patterned conductive layer on the first dielectric layer, forming a first patterned blocking layer connected to the first patterned conductive layer, and removing a portion of the first dielectric layer.

As mentioned above, in the micro-electromechanical device and the manufacturing method thereof according to the invention, the dielectric layer is covered by the blocking layer or by the blocking layer and the conductive layer so that the suspended structure of the micro-electromechanical device has better structure rigidity. In addition, the dielectric layer, which will not be removed, has been covered by other material layers (e.g., the blocking layer, the conductive layer and the like). Therefore, the micro-electromechanical device, which has good structure intensity and precise shape and is manufactured simply, can be obtained without precisely controlling the time and environment of the etching process.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 4:
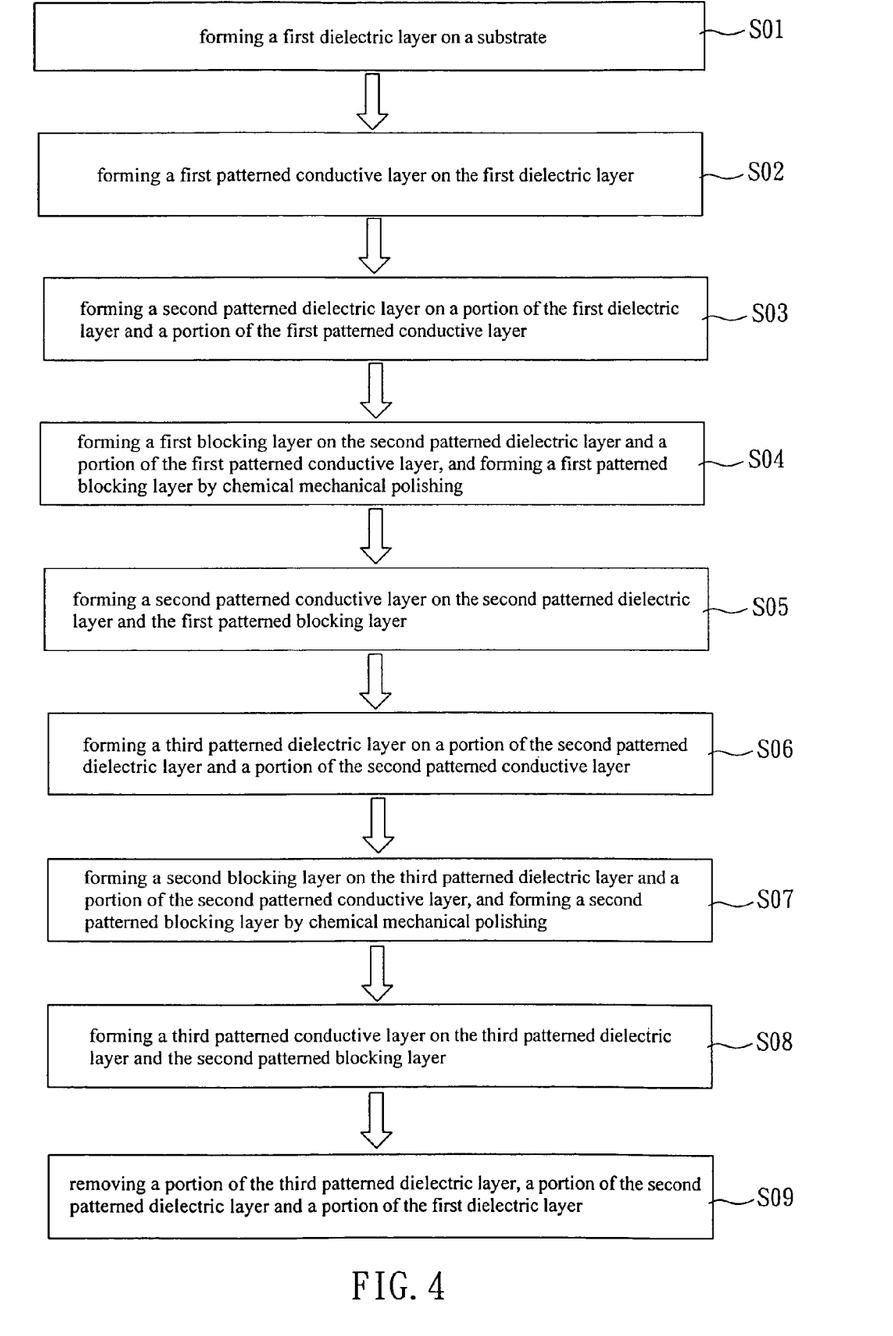
FIG. 4 is a flow chart showing a manufacturing method of a micro-electromechanical device according to a first embodiment of the invention.

Referring to FIG. 4, a manufacturing method of a micro-electromechanical device according to a first embodiment of the invention includes steps S01 to S09. In this embodiment, the manufacturing method of the micro-electromechanical device is performed according to CMOS manufacturing processes.

Figure 5A:
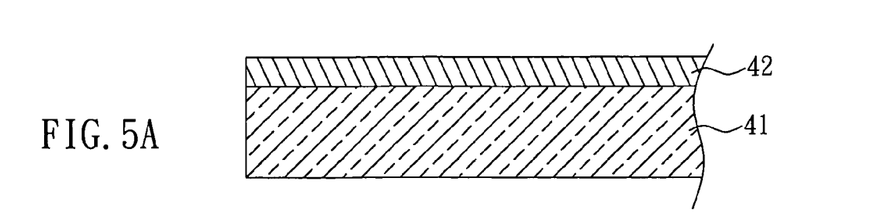
FIGS. 5A to 5G are schematic illustrations showing the micro-electromechanical device of FIG. 4.

As shown in FIG. 5A, a first dielectric layer 42 is formed on a substrate 41 in step S01.

Figure 5B:
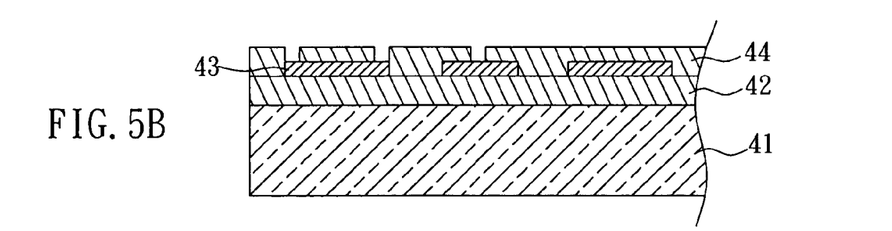

As shown in FIG. 5B, a first patterned conductive layer 43 is formed on the first dielectric layer 42 in step S02. In step S03, a second patterned dielectric layer 44 is formed on a portion of the first dielectric layer 42 and a portion of the first patterned conductive layer 43. In this embodiment, the first patterned conductive layer 43 can be formed by patterning a first conductive layer using the etching technology after the first conductive layer (not shown) is formed on the first dielectric layer 42.

Figure 5C:
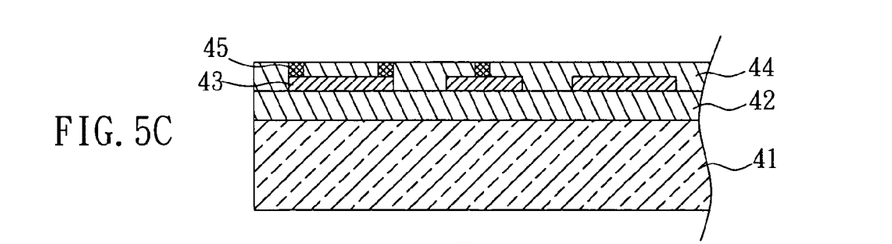

As shown in FIG. 5C, a first blocking layer is formed on the second patterned dielectric layer 44 and a portion of the first patterned conductive layer 43, and a first patterned blocking layer 45 is formed by chemical mechanical polishing the first blocking layer, as shown in step S04.

Figure 5D:
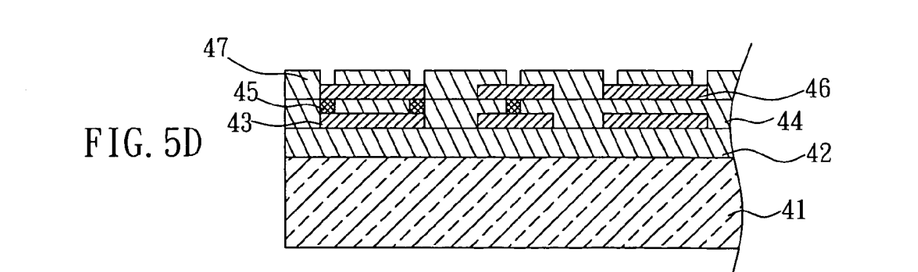

As shown in FIG. 5D, a second patterned conductive layer 46 is formed on the second patterned dielectric layer 44 and the first patterned blocking layer 45 in step S05. In step S06, a third patterned dielectric layer 47 is formed on a portion of the second patterned dielectric layer 44 and a portion of the second patterned conductive layer 46. In this embodiment, the second patterned conductive layer 46 and the first patterned conductive layer 43 can be formed by the same method.

Figure 5E:
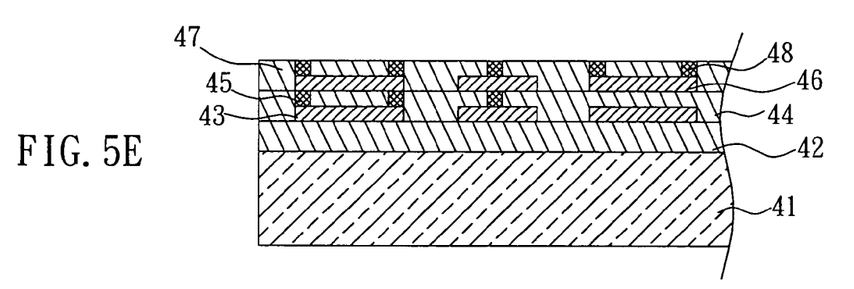

As shown in FIG. 5E, a second blocking layer is formed on the third patterned dielectric layer 47 and a portion of the second patterned conductive layer 46, and a second patterned blocking layer 48 is formed by, for example, chemical mechanical polishing the second blocking layer, as shown in step S07.

Figure 5F:
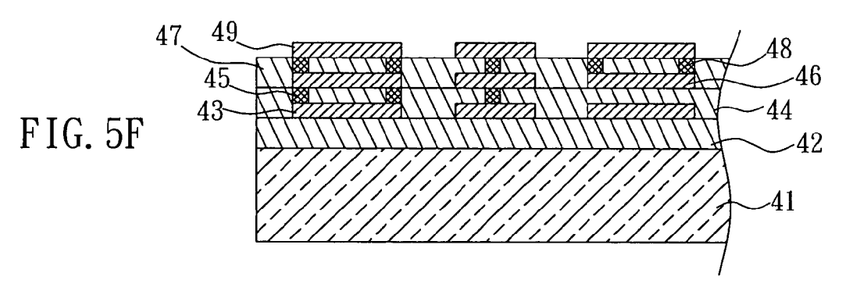

As shown in FIG. 5F, a third patterned conductive layer 49 is formed on the third patterned dielectric layer 47 and the second patterned blocking layer 48 in step S08. In this embodiment, the third patterned conductive layer 49 is also formed by etching.

Figure 5G:
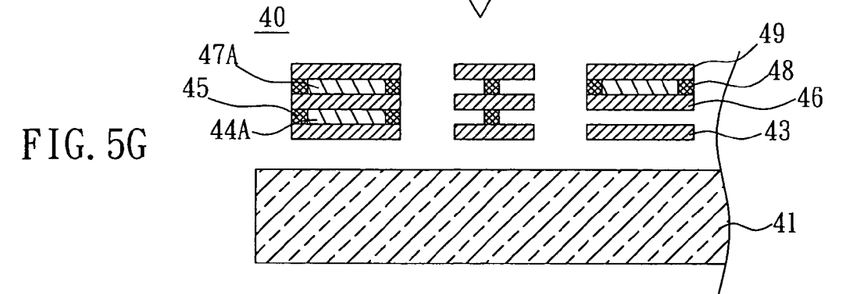

In step S09, a portion of the third patterned dielectric layer 47, a portion of the second patterned dielectric layer 44 and the first dielectric layer 42 are removed to form a micro-electromechanical device 40, as shown in FIG. 5G. Herein, the conductive layers and blocking layers connected together serve as a single electrode or a fixed end. In this embodiment, since the dielectric layers to be reserved have been covered by the conductive layers and the blocking layers, the portion of the third patterned dielectric layer 47, the portion of the second patterned dielectric layer 44 and the first dielectric layer 42 can be easily and precisely removed by isotropic etching, anisotropic etching, dry-etching, wet etching or hydrofluoric acid etching. Accordingly, the second patterned dielectric layer 44A or the third patterned dielectric layer 47A is formed. More particularly, they can be removed without precisely controlling the etching time. The second patterned dielectric layer 44A is covered by the first patterned conductive layer 43, the second patterned conductive layer 46 and/or the first patterned blocking layer 45. The third patterned dielectric layer 47A is covered by the second patterned conductive layer 46, the third patterned conductive layer 49 and/or the second patterned blocking layer 48.

Furthermore, since the blocking layers are connected to more than two conductive layers to serve as the single electrode or the fixed end of the micro-electromechanical device in this invention, the electrode or the fixed end cannot be removed when each dielectric layer is being removed. Thus, the obtained electrode or fixed end of the micro-electromechanical device can have good structure intensity and precise shape, and can be manufactured easily.

In this embodiment, the material of each of the first dielectric layer 42, the second patterned dielectric layer 44 and the third patterned dielectric layer 47 can be silicon oxide. The material of each of the first patterned conductive layer 43, the second patterned conductive layer 46, the third patterned conductive layer 49, the first patterned blocking layer 45 and the second patterned blocking layer 48 can be polysilicon, metal silicide, metal, or a composition or alloy thereof. In addition, the metal can be gold, silver, tungsten, aluminum or copper.

In addition, when the first patterned blocking layer 45 and the second patterned blocking layer 48 are both made of conductive materials, the first patterned blocking layer 45 is electrically connected to the first patterned conductive layer 43 and the second patterned conductive layer 46, and the second patterned blocking layer 48 is electrically connected to the second patterned conductive layer 46 and the third patterned conductive layer 49.

Furthermore, the blocking layers are disposed between the two adjacent conductive layers in the above-mentioned embodiment. To be noted, the invention is not limited thereto, and the blocking layers only have to be connected to the conductive layers. In brief, the blocking layer can be formed on edges of the two adjacent conductive layers and connected thereto so that portions of the dielectric layers can be covered.

In the above-mentioned embodiment, the stacking formation only reaches the third patterned conductive layer 49. Of course, an $N^{th}$ patterned blocking layer, an $(N-1)^{th}$ patterned conductive layer or an $N^{th}$ dielectric layer can also be continuously formed on the third patterned conductive layer 49 according to the required function. Herein, N is a positive integer greater than or equal to 3.

Figure 6:
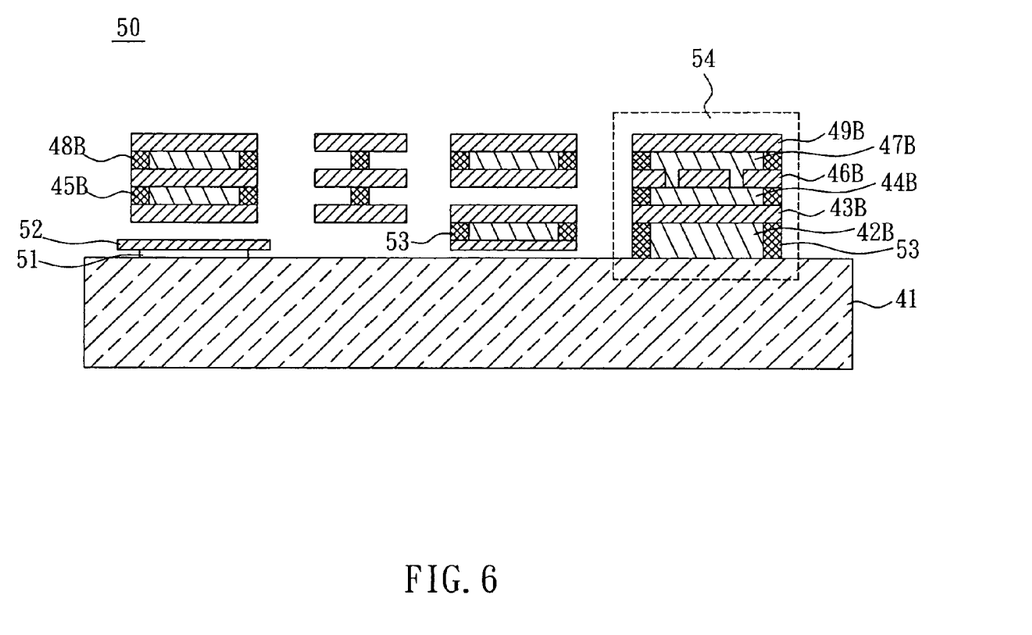
FIG. 6 is a schematic illustration showing a micro-electromechanical device according to a second embodiment of the invention.

As shown in FIG. 6, a first patterned conductive layer 43B, a second patterned dielectric layer 44B, a first patterned blocking layer 45B, a second patterned conductive layer 46B, a third patterned dielectric layer 47B, a second patterned blocking layer 48B and a third patterned conductive layer 49B with different patterns can also be formed on the substrate 41 using the manufacturing method of the first embodiment in a micro-electromechanical device 50 according to a second embodiment of the invention.

In this embodiment a patterned oxide layer 51 and a bottom patterned conductive layer 52 can be sequentially formed on the substrate 41 in advance in the micro-electromechanical device 50. The bottom patterned conductive layer 52 corresponds to a portion of the first patterned conductive layer 43B. In addition, the micro-electromechanical device 50 can further have a patterned supporting blocking layer 53 disposed between the substrate 41 and a portion of the first patterned conductive layer 43B to enhance the structure intensity of the fixed end. More particularly, a first patterned dielectric layer 42B can be formed among the substrate 41, the first patterned conductive layer 43B and the patterned supporting blocking layer 53 after the etching process so that the structure intensity of the fixed end is further enhanced. Furthermore, the patterned supporting blocking layer 53 can also be disposed between a portion of the first patterned conductive layer 43B and a portion of the bottom patterned conductive layer 52 in order to enhance the structure intensity of the electrode portion.

In this embodiment, the fixed end 54 is constituted by the patterned supporting blocking layer 53, the first patterned dielectric layer 42B, the first patterned conductive layer 43B, the first patterned blocking layer 45B, the second patterned dielectric layer 44B, the second patterned conductive layer 46B, the second patterned blocking layer 48B, the third patterned dielectric layer 47B and the third patterned conductive layer 49B. The dielectric layers between the fixed end 54 and the substrate 41 are covered by the conductive layers and the blocking layers. Therefore, it is possible to avoid the problem that portions of the dielectric layers are removed in the etching process to cause the insufficient structure intensity of the fixed end 54. In addition, it is unnecessary to reverse a larger space for etching. Thus, the area occupied by the micro-electromechanical device can be significantly reduced.

In summary, the micro-electromechanical device and the manufacturing method thereof according to the invention have the following features. The dielectric layer is covered by the blocking layer or by the blocking layer and the conductive layer so that the suspended structure of the micro-electromechanical device has better structure rigidity. In addition, the dielectric layer, which will not be removed, has been covered by other material layers (e.g., the blocking layer, the conductive layer and the like). Therefore, the micro-electromechanical device, which has good structure intensity and precise shape and is manufactured simply, can be obtained without precisely controlling the time and environment of the etching process.

Although the invention has been described with reference to specific embodiments, this description is not meant to be construed in a limiting sense, Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A micro-electromechanical device comprising:
a substrate;
a first patterned conductive layer disposed on the substrate;
a second patterned conductive layer disposed on the first patterned conductive layer;
a first patterned blocking layer disposed between the first patterned conductive layer and the second patterned conductive layer, and connected to the first patterned conductive layer and the second patterned conductive layer;
a patterned supporting blocking layer disposed between a portion of the first patterned conductive layer and the substrate; and
a first patterned dielectric layer covered by the substrate, the patterned supporting blocking layer and the first patterned conductive layer.

2. The micro-electromechanical device according to claim 1, wherein a material of the first patterned dielectric layer is silicon oxide.

3. The micro-electromechanical device according to claim 1, wherein a material of the first patterned conductive layer, the first patterned blocking layer or the second patterned conductive layer is polysilicon, metal silicide, metal, or a composition or alloy thereof.

4. The micro-electromechanical device according to claim 3, wherein the metal is gold, silver, tungsten, aluminum or copper.

5. The micro-electromechanical device according to claim 1, further comprising a second patterned dielectric layer covered by the first patterned conductive layer, the second patterned conductive layer and the first patterned blocking layer.

6. The micro-electromechanical device according to claim 5, wherein a material of the second patterned dielectric layer is silicon oxide.

7. The micro-electromechanical device according to claim 1, further comprising:
at least one $N^{th}$ patterned conductive layer disposed on an $(N-1)^{th}$ patterned conductive layer; and
at least one $(N-1)^{th}$ patterned blocking layer connected to the $(N-1)^{th}$ patterned conductive layer and the $N^{th}$ patterned conductive layer, wherein N is a positive integer greater than or equal to 3.

8. The micro-electromechanical device according to claim 7, wherein a material of the $(N-1)^{th}$ patterned blocking layer or the $N^{th}$ patterned conductive layer is polysilicon, metal silicide, metal, or a composition or alloy thereof.

9. The micro-electromechanical device according to claim 7, further comprising a patterned dielectric layer disposed among the $(N-1)^{th}$ patterned conductive layer, the $N^{th}$ patterned conductive layer and the $(N-1)^{th}$ patterned blocking layer.

10. The micro-electromechanical device according to claim 9, wherein a material of the patterned dielectric layer is silicon oxide.

11. The micro-electromechanical device according to claim 1, further comprising:
a patterned oxide layer disposed on the substrate; and
a bottom patterned conductive layer disposed on the patterned oxide layer and disposed opposite to a portion of the first patterned conductive layer.

12. The micro-electromechanical device according to claim 1, further comprising:
a third patterned conductive layer disposed on the substrate;
a fourth patterned conductive layer disposed on the third patterned conductive layer; and
a second patterned blocking layer connected to the third patterned conductive layer and the fourth patterned conductive layer, wherein the third patterned conductive layer is disconnected from the first patterned blocking layer.

* * * * *